(12) United States Patent
Yasuda et al.

(10) Patent No.: US 6,972,060 B2
(45) Date of Patent: Dec. 6, 2005

(54) METHOD FOR PRODUCING STACKED CERAMIC BODY

(75) Inventors: Eturo Yasuda, Nishio (JP); Atsuhiro Sumiya, Nishio (JP); Hitoshi Shindo, Nishio (JP); Toshiatsu Nagaya, Kuwana (JP); Takashi Yamamoto, Chiryu (JP)

(73) Assignee: Nippon Soken, Inc., Nishio (JP)

( * ) Notice: Subject to any disclaimer, the term of this patent is extended or adjusted under 35 U.S.C. 154(b) by 0 days.

(21) Appl. No.: 10/405,234

(22) Filed: Apr. 3, 2003

(65) Prior Publication Data

US 2003/0188820 A1    Oct. 9, 2003

(30) Foreign Application Priority Data

Apr. 5, 2002  (JP) .............................. 2002-103421

(51) Int. Cl.⁷ ...................... C03B 29/00; H01L 41/083
(52) U.S. Cl. ............... 156/89.14; 156/89.16; 156/89.18; 264/618; 264/674
(58) Field of Search ........................ 155/89.12, 89.14, 155/89.16, 89.18; 264/614, 615, 618, 613, 264/674, 676, 677, 678; 29/25.35

(56) References Cited

U.S. PATENT DOCUMENTS

| | | | | |
|---|---|---|---|---|
| 4,971,738 A | * | 11/1990 | Herron et al. | ........... 156/89.18 |
| 6,182,340 B1 | * | 2/2001 | Bishop | ....................... 29/25.35 |
| 6,260,248 B1 | * | 7/2001 | Cramer et al. | ............. 29/25.35 |
| 6,322,718 B1 | * | 11/2001 | Dai et al. | ............. 252/62.9 PZ |
| 6,690,571 B2 | * | 2/2004 | Shindo et al. | ............... 361/311 |
| 2002/0079622 A1 | * | 6/2002 | Randall et al. | ............. 264/618 |
| 2002/0098333 A1 | * | 7/2002 | Feltz et al. | .................. 428/210 |
| 2002/0121329 A1 | * | 9/2002 | Shindo et al. | ........... 156/89.12 |
| 2002/0160904 A1 | * | 10/2002 | Sumiya et al. | ............... 501/134 |
| 2003/0027432 A1 | * | 2/2003 | Sumiya et al. | ............... 438/761 |
| 2003/0168624 A1 | * | 9/2003 | Hammer et al. | ...... 252/62.9 PZ |
| 2003/0207150 A1 | * | 11/2003 | Maria et al. | ................. 428/675 |

FOREIGN PATENT DOCUMENTS

| | | | |
|---|---|---|---|
| JP | 4-171990 | * | 6/1992 |
| JP | A-5-82387 | | 4/1993 |
| JP | 6-252469 | * | 9/1994 |
| JP | A-2001-244519 | | 9/2001 |
| WO | 01/93345 | * | 12/2001 |

* cited by examiner

Primary Examiner—Melvin Mayes
(74) Attorney, Agent, or Firm—Nixon & Vanderhye P.C.

(57) ABSTRACT

This invention provides a method for producing a stacked ceramic body that does not require strict control of an oxygen partial pressure in a sintering gas. To produce a stacked ceramic body by alternately stacking dielectric layer and electrode layers, an unsintered stacked body 2 is prepared by alternately stacking unsintered dielectric layers containing a PZT type dielectric material and unsintered electrode layers containing an electrode material, and is sintered in a sintering gas to which a dielectric layer anti-reducing agent 21 and an electrode layer anti-oxidant 22 are introduced. Alternatively, sintering is conducted in a gas containing only the dielectric layer anti-reducing agent 21 or in a gas containing only the electrode layer anti-oxidant 22.

7 Claims, 4 Drawing Sheets

METHOD FOR PRODUCING STACKED CERAMIC BODY

BACKGROUND OF THE INVENTION

1. Field of the Invention

This invention relates to a method for producing a stacked ceramic body by alternately stacking dielectric layers and electrode layers.

2. Description of the Related Art

A piezoelectric actuator has been developed as an injector driving device of a Diesel engine and a displacement device in a variety of positioning apparatuses.

The piezoelectric device has a construction in which a pair of external electrodes is provided to a stacked ceramic body formed by alternately stacking dielectric layers and electrode layers. The stacked ceramic body is produced by the step of sintering an unsintered stacked body that is in turn produced by alternately stacking unsintered dielectric layers and unsintered electrode layers.

A PZT type material that has been used in the past as the dielectric layer of the stacked ceramic body needs a sintering temperature of about 1,100° C. Therefore, an expensive precious metal such as Pd must be unavoidably used for the electrode layer of the stacked ceramic body the dielectric layer of which uses the PZT type material.

To reduce the cost, therefore, a PZT type material capable of being sintered at 950° C. or below has been developed, and a stacked ceramic body using a base metal such as Cu for the electrode layer has been proposed.

However, the base metal such as Cu is more easily oxidizable than the precious metal such as Pd. Therefore, when the unsintered stacked body is sintered in air, Cu is oxidized to a Cu oxide. As the specific resistance becomes high, the desired electric characteristics cannot be obtained easily.

As Cu increases in volume due to expansion when it changes to the Cu oxide, the electrode layer is likely to peel.

When the oxygen partial pressure inside the sintering gas is low, on the other hand, oxidation of Cu can be prevented, but bonding of an interface becomes insufficient between the electrode layer and the dielectric layer adjacent to the former, so that peeling is likely to occur between the electrode layer and the dielectric layer.

Another problem is that when reduced, the dielectric layer creates metallic Pb, and this metallic Pb reacts with Cu of the electrode layer to thereby invite dissolution of the electrode layer. When the metallic layer dissolves, the electrode layer of the stacked ceramic body becomes island-like and is likely to fail to operate as a voltage impression electrode on the dielectric layer.

To prevent these problems, it is necessary to strictly control the oxygen partial pressure of the sintering gas by using a gas system having a complicated composition when the unsintered stacked body is sintered. In other words, it is necessary to control the sintering gas to an oxygen partial pressure at which PZT, or the like, of the dielectric layer is not reduced and Cu, or the like, of the electrode layer is not oxidized.

Figure 3:
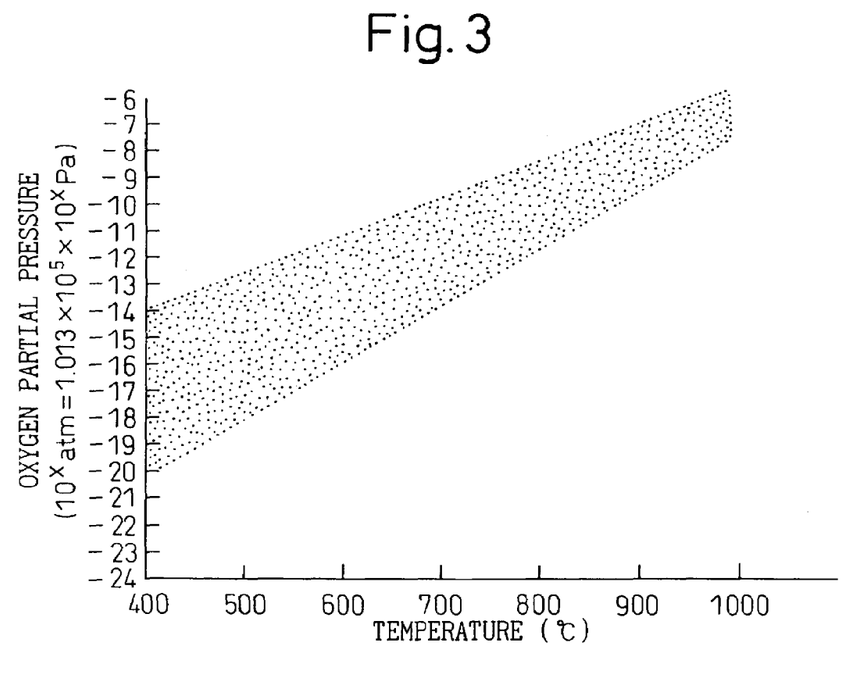
FIG. 3 is a graph showing a temperature at which Cu is not oxidized and PZT is not reduced, and an oxygen partial pressure, that is derived from an Ellingham diagram.

To satisfy the condition described above, the sintering gas must be controlled to a dotted range in FIG. 3 of the temperature and the oxygen partial pressure at which Cu is not oxidized and PZT is not reduced, the range being derived from an Ellingham diagram.

In other words, sintering must be conducted at an oxygen partial pressure corresponding to a temperature. Therefore, a production process is extremely complicated, and control is very troublesome. Further, even when an attempt is made to reduce the cost of the electrode layer, the production process results in an increase in the production cost.

Because control is troublesome, defective stacked ceramic bodies are likely to develop and this production method has a low yield.

Incidentally, these problems hold true not only of the stacked ceramic body for use in the actuator but also of those stacked ceramic bodies in which the dielectric layer mainly contains PbO and the electrode layer contains an easily oxidizable base metal electrode such as CU, and which is used for a ceramic capacitor and a multi-layered substrate.

SUMMARY OF THE INVENTION

In view of the problems described above, this invention aims at providing a method, for producing a stacked ceramic body, that need not strictly control an oxygen partial pressure in a sintering gas.

According to a first aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; and sintering the unsintered stacked body inside a sintering gas to which a dielectric layer anti-reducing agent and an electrode layer anti-oxidant are introduced.

Next, the function and effect of the invention will be explained.

In the first invention, a dielectric layer anti-reducing agent and an electrode layer anti-oxidant are introduced into a sintering gas for an unsintered stacked body.

The dielectric layer anti-reducing agent and the electrode layer anti-oxidant are the materials that operate as a sacrifice to protect the unsintered stacked body, respectively.

In other words, oxidation of the electrode layer is likely to proceed in a sintering gas having a high oxygen partial pressure. The electrode layer anti-oxidant stipulated in the invention of claim 1 is a material that is more easily oxidized than the electrode layer, acquires oxygen in the atmosphere and is oxidized itself. The oxygen partial pressure inside the sintering gas drops with the progress of this reaction, and drops finally to a level at which the electrode layer is not oxidized.

Reduction of the dielectric layer is likely to proceed in a sintering gas having a low oxygen partial pressure. The dielectric layer anti-reducing agent according to the invention is a material that is more easily reduced than the dielectric layer, is reduced more quickly than the dielectric layer and emits oxygen in the sintering gas. The oxygen partial pressure inside the sintering gas rises with the progress of this reaction, and finally reaches a level at which the dielectric layer is not reduced.

An oxygen sensor, for example, is disposed in the sintering gas in the proximity of the unsintered stacked body and the oxygen partial pressure of the sintering gas is controlled by use of this oxygen sensor. Even when a gas composition of the sintering gas is adjusted to control the oxygen partial pressure, the oxygen partial pressure of the entire sintering gas cannot always be controlled appropriately. Furthermore, the temperature affects a suitable oxygen partial pressure as can be clearly seen from the Ellingham diagram shown in FIG. 3.

Furthermore, there is the case where the heating speed is increased to prevent de-lamination between the dielectric layer and the electrode layer. In this case, it is not practically possible, at present, to appropriately control the oxygen partial pressure corresponding to the ambient temperature of the unsintered stacked body.

Therefore, the width of the range in which the oxygen partial pressure can be controlled becomes narrow, and diffusion and melting of the electrode layer often occur.

However, the inventors of this invention have found through careful examination that even when the trouble described above occurs, the inside of the unsintered stacked body has less denaturation resulting from the trouble than its surface, and a relatively excellent electrode layer remains formed.

In other words, when the surface portion of the unsintered stacked body is denatured, the oxygen partial pressure of the gas is adjusts itself. When the oxygen partial pressure is high, the electrode layer is oxidized and when the oxygen partial pressure is low, the dielectric layer is reduced. As a result, oxygen goes into and comes out from the gas, thereby adjusting the oxygen partial pressure.

According to the first invention described above, the sintering gas reaches, by itself, a suitable oxygen partial pressure, and neither oxidation of the electrode layer nor reduction of the dielectric layer occurs easily.

According to a second aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; and sintering the unsintered stacked body inside an oxidizing sintering gas to which an electrode layer anti-oxidant is introduced.

According to a third aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; and sintering the unsintered stacked body inside a reducing sintering gas into which an dielectric layer anti-reducing agent is introduced.

Sintering in the second invention is sintering in an oxidizing sintering gas. Sintering in the third invention is sintering in a reducing sintering gas. Therefore, oxidation of the electrode layer is likely to occur in the second invention, and is prevented by use of the electrode layer anti-oxidant. In the third invention, reduction of the dielectric layer is likely to occur, and is prevented by use of the dielectric layer anti-reducing agent. The detailed mechanism of prevention is the same as that of the first invention.

According to a fourth aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; and sintering the unsintered stacked body inside a sintering gas to which a gas passed through a dielectric layer anti-reducing agent and through an electrode layer anti-oxidant is introduced.

According to a fifth aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; and sintering the unsintered stacked body inside a sintering gas to which an oxidizing gas passed through an electrode layer anti-oxidant is introduced.

According to a sixth aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; and sintering the unsintered stacked body inside a sintering gas to which a reducing gas, which has passed through a dielectric layer anti-reducing agent, is introduced.

In the fourth to sixth inventions, the unsintered stacked body is sintered in the sintering gas into which the gas that is in advance passed through the electrode layer anti-oxidant or through the dielectric layer anti-reducing agent, is introduced. Therefore, the sintering gas itself reaches an oxygen partial pressure at which oxidation of the electrode layer does not easily occur and at which reduction of the dielectric layer does not easily occur, in the same way as in the first to third inventions.

In this instance, each gas, the electrode layer anti-oxidant and the dielectric layer anti-reducing agent preferably have an interlocking relation with the temperature of the sintering gas.

According to a seventh aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; and sintering the unsintered stacked body while it is covered with powder consisting of at least one of PZT, $PbZrO_3$, $PbTiO_3$ and PbO.

The unsintered stacked body is covered with powder described above. When this powder is reduced, it emits oxygen. The electrode layer in the proximity of the unsintered stacked body covered with the powder reaches an oxygen partial pressure at which the electrode layer is not oxidized and the dielectric layer is not reduced.

According to an eighth aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; and sintering the unsintered stacked body while it is covered with a covering material made of a material hardly reacting with the unsintered stacked body.

In this case, the electrode is oxidized while the dielectric layer is reduced in accordance with the oxygen partial pressure of the sintering gas. However, the periphery of the unsintered stacked body is covered with the covering material, and the gas around the unsintered stacked body is under the state where it cannot easily cause a gas exchange with the outside.

Therefore, the sintering gas in the proximity of the unsintered stacked body reaches, by itself, a state having an oxygen partial pressure at which the electrode is not oxidized and the dielectric layer is not reduced.

According to a ninth aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; introducing the unsintered stacked body into a sintering vessel and bringing the sintering vessel into vacuum; and introducing a gas in such a manner as to achieve a predetermined oxygen partial pressure, and then conducting sintering.

After the inside of the sintering vessel is once brought to a vacuum, a gas is so introduced as to achieve a predetermined oxygen partial pressure. Therefore, adjustment of the oxygen partial pressure is easy. Because the sintering gas inside the sintering vessel does not easily cause a gas exchange with the outside, the sintering gas around the unsintered stacked body reaches, itself, a state of oxygen partial pressure, due to absorption of oxygen with oxidation of the electrode layer and emission of oxygen with reduction of the dielectric layer, at which the electrode layer is not oxidized and the dielectric layer is not reduced.

The first to ninth inventions described above can provide a method for producing a stacked ceramic body that does not require to strictly regulate the oxygen partial pressure in the sintering gas.

According to a tenth aspect of the invention, there is provided a method for producing a stacked ceramic body by alternately stacking dielectric layers and electrode layers, comprising the steps of preparing an unsintered stacked body by alternately stacking unsintered dielectric layers containing a PZT type dielectric material and unsintered electrode layers containing an electrode material; and sintering the unsintered stacked body while it is covered with a covering material made of a material which hardly reacts with the unsintered stacked body.

DESCRIPTION OF THE PREFERRED EMBODIMENTS

In each of the inventions, a dielectric layer of a stacked ceramic body is formed of an unsintered dielectric layer containing a PZT type dielectric material. The PZT type dielectric material mainly consists of lead zircotitanate, and its A site may be substituted by divalent metal ions of barium and strontium and monovalent metal ions of Ag, Na and K.

A B site preferably uses the combinations of the following positive metal ions for partial substitution of tetravalent positive ions of Zr and Ti of the B site of the ceramic of ferroelectric perovskite.

(a) a combination of monovalent and quinquevalent positive metal ions, $M^I_{1/4}M^V_{3/4}$ ($M^I$=Na, K; $M^V$=Nb, Ta);

(b) a combination of divalent and quinquevalent positive metal ions, $M^{II}_{1/3}M^V_{2/3}$ ($M^{II}$=Mg, Zn, Ni, Co; $M^V$= Nb, Ta);

(c) a combination of trivalent and quinquevalent positive metal ions, $M^{III}M^V$ ($M^{III}$=Fe, In, Sc, relatively heavy lanthanoids; $M^V$=Nb, Ta);

(d) $M^{III}_{2/3}M_{VI1/3}$ ($M^{III}$=Fe, In, Sc, relatively heavy lanthanoids; $M^{VI}$=W);

(e) $M^{II}_{1/2}M^{VI}_{1/2}$ ($M^{II}$=Mg, Co, Ni; $M^{VI}$=W)

An electrode layer of the stacked ceramic body is formed of an unsintered electrode layer containing an electrode material. The electrode material can use Cu as a material of a base metal electrode, Cu that contains alloy glass frit added thereto, and copper alloys.

Because the Cu-containing material can be sintered at a low temperature and is an economical and good electric conductor, it is preferred as the electrode material of the stacked ceramic body of the invention.

The sintering gas in the invention may contain a gas as a single substance and a mixed gas of a plurality of gases containing oxygen, such as $N_2$, $N_2$—$H_2$, CO—$CO_2$, and so forth.

Besides the application as a capacitor, the stacked ceramic body according to the invention can be used as a piezoelectric device fabricated by forming the electric layer from a material having a piezoelectric effect and by alternately applying positive and negative voltages to the dielectric layer.

The electrode layer anti-oxidant described above preferably consists of at least one of Cu and $Cu_2O$. When existing in the sintering gas, these Cu and $Cu_2O$ are oxidized to CuO as a sacrifice to the electrode layer and consume oxygen inside the gas.

Consequently, oxidation of the electrode layer can be prevented.

The dielectric layer anti-reducing agent described above preferably consists of at lest one member selected from the group of PbO, $PbTiO_2$, PZT, $PbZrO_3$, CuO and $Cu_2O$.

In this case, too, these materials are oxidized as a sacrifice to protect the dielectric layer and emit oxygen when they exist in the sintering gas in the same way as described above. Consequently, oxidation of the dielectric layer can be prevented.

Oxidation and reduction occur in the electrode layer and in the dielectric layer in the eighth invention, but precipitation of the oxides and the metal materials remain on the surface of the unsintered stacked body. Therefore, the stacked ceramic body having the electrode layer and the dielectric layer that are free from oxidation and reduction can be obtained when processing such as polishing, cutting, etc, is applied to the surface after the unsintered stacked body is sintered.

Magnesia (magnesium oxide) can be used as a covering material that covers the unsintered stacked body in the eighth invention.

The covering material can take the form of a sheet or a vessel and can cover the unsintered stacked body with the sheet-like covering material (see FIG. 5), or the covering material in the powder form can bury the unsintered stacked body.

An oxygen partial pressure inside the sintering vessel is preferably from $1.013 \times 10^{-1}$ to $1.013 \times 10^{-5}$ Pa.

When the oxygen pressure is adjusted to the level described above, it is possible to acquire the sintering gas in which the electrode is not easily oxidized and the dielectric layer is not easily reduced.

When the oxygen partial pressure is less than $1.013 \times 10^{-5}$ Pa, the oxygen amount in the gas is so small that sintering becomes sintering in the reducing gas and reduction of the dielectric layer is likely to develop. When the oxygen partial pressure is greater than $1.013 \times 10^{-1}$ Pa, the oxygen amount in the gas is so large, on the contrary, that oxidation of the electrode layer is likely to develop.

Next, embodiments of the invention will be explained with reference to the drawings.

(Embodiment 1)

A method for producing the stacked ceramic body according to the invention will be explained with reference to FIGS. 1 to 4.

Figure 1:
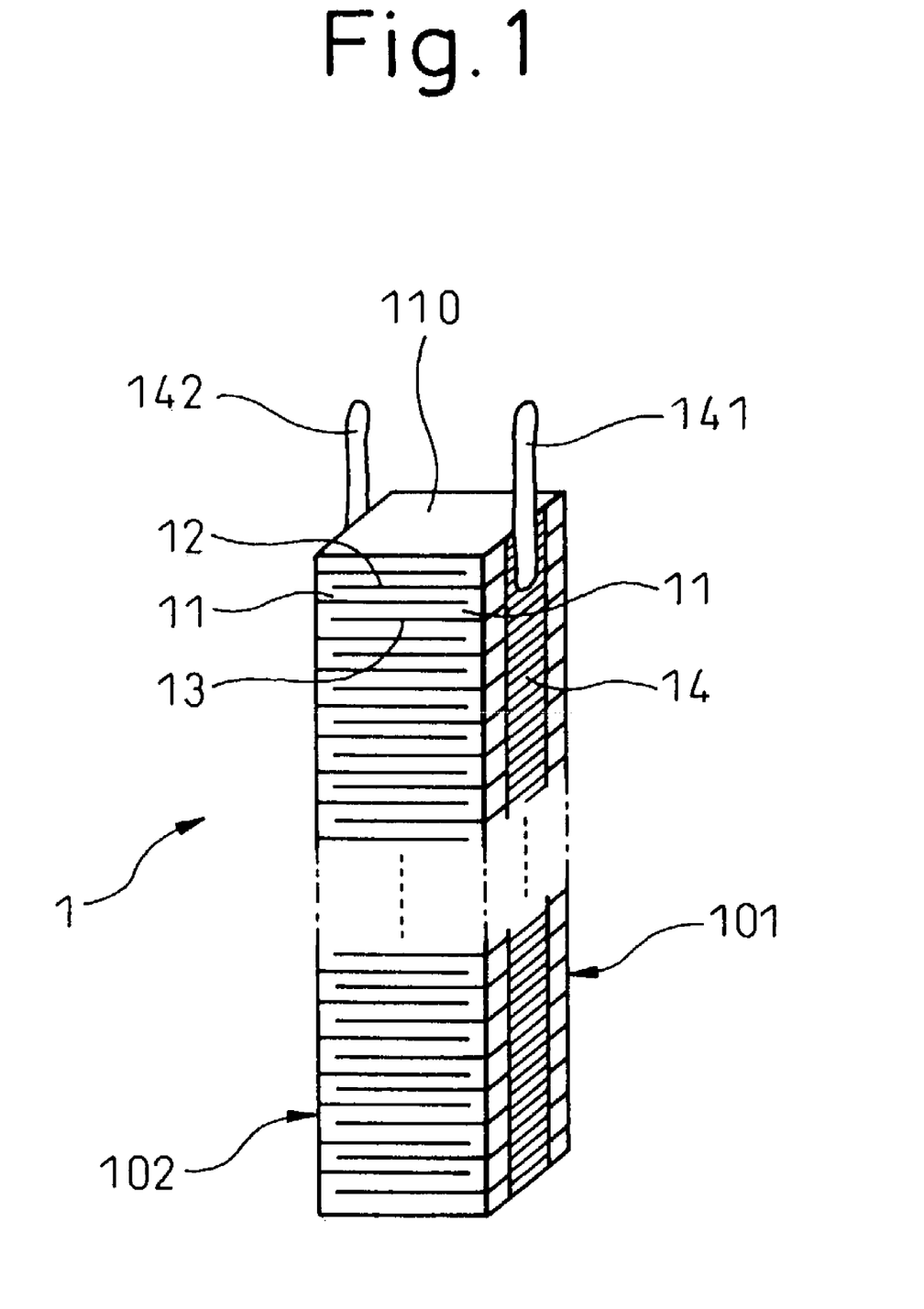
FIG. 1 is a perspective view of a stacked ceramic body according to Embodiment 1.

To produce the stacked ceramic body 1 having the dielectric layers 11 and the electrode layers 12, 13 alternately stacked as shown in FIG. 1, an unsintered stacked body 2 is first prepared by alternately stacking unsintered dielectric layers containing a PZT type dielectric material and unsintered electrode layers containing an electrode material. The unsintered stacked body 2 is then sintered in a sintering temperature into which a dielectric layer anti-reducing agent 21 and an electrode layer anti-oxidant 22 are introduced.

Hereinafter, explanation will be given in detail.

Figure 2:
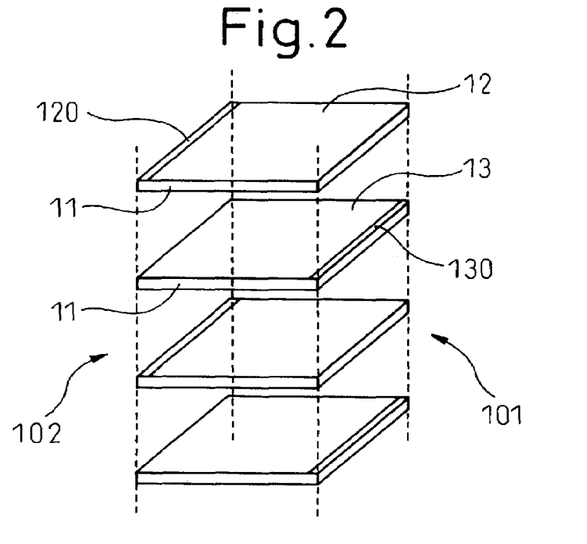
FIG. 2 is an expanded view of the stacked ceramic body in Embodiment 1.

This embodiment relates to a stacked ceramic body 1 operating as a stacked piezoelectric device consisting of dielectric layers 11 having a rectangular section and including side surface electrodes 14 and lead wires 141 and 142 arranged on side surfaces 101 and 102 as shown in FIGS. 1 and 2. Incidentally, electrode layers 12 and 13 are omitted in FIG. 1.

The dielectric layer 11 is formed of a piezoelectric material. Two electrode layers 12 and 13 adjacent to the dielectric layer 11 apply a voltage to the dielectric layer 11, and the stacked ceramic body 1 undergoes extension and contraction in the stacking direction.

The supply of power to the electrode layers 12 and 13 is made through the side surface electrodes 14 and the lead wires 141 and 142, and the lead wires 141 and 142 are connected to a power source not shown in the drawings.

The stacked ceramic body 1 is produced by alternately stacking the dielectric layers 11 each having the electrode layer 12 exposed on its side surface 101 and an electrode non-formation portion 120 on its opposite side surface 101 and the dielectric layers 11 each having an electrode non-formation portion 130 on its side surface 101 and the electrode layer 13 exposed on its opposite side surface 102, as shown in FIG. 2.

The side surface electrode 14 is so arranged as to cover an end face of the electrode layer 12 exposed on the side surface 101, and the lead wire 141 is provided to the side surface electrode 14. Similarly, the side surface electrode 14 and the lead wire 142 are arranged on the side surface 102.

Next, the production method of the stacked ceramic body 1 will be explained in detail.

Raw material powder containing the PZT type dielectric material that can be sintered at 950° C. is mixed in a ball mill, is subjected to calcination at 700 to 850° C. for 5 hours and is then pulverized in a pearl mill. Additives having low melting points are added to milled powder thus obtained so that the material can be sintered at 950° C., and a resin and an organic solvent are added to obtain a slurry. A green sheet is obtained from the resulting slurry by use of a doctor blade method, and is used as the unsintered dielectric layer.

Suitable amounts of one or more kinds of Cu, CuO and $CuO_2$ (that are to serve as the electrode material) are mixed, and powder having the same composition as that of the dielectric layer as the same powder is converted to paste. The electrode paste is screen-printed into a predetermined pattern to the unsintered dielectric layer 2 to form the unsintered electrode layer.

Twenty unsintered dielectric layers having the unsintered electrode layers formed thereon in this way are stacked and pressure-bonded. Next, this stacked body is cut in such a fashion that the surface in a direction perpendicular to the stacking direction has a predetermined size. In this way are obtained green chips having 20 layers.

Twenty layers of the green chips are further stacked and are pressure-bonded to obtain the unsintered stacked body 2.

The unsintered stacked body 2 containing CuO and $Cu_2O$ are subjected to binder-removing treatment in air at 500° C. for 5 hours. Thereafter, an electrode reducing-sintering treatment is conducted for the unsintered stacked body 2 at 330° C. for 12 hours. As the electrode is oxidized, reduction of the electrode is conducted with $H_2$ at around 300° C. The unsintered stacked body 2 not containing CuO or $Cu_2O$ is subjected to the binder-removing treatment in nitrogen, and the electrode reducing step is omitted.

Next, the dielectric layer anti-reducing agent 21 and the electrode layer anti-oxidant 22 are introduced into the sintering gas, and sintering is conducted at 950° C. for 2 hours.

The state of this sintering operation will be explained with reference to FIG. 4.

Figure 4:
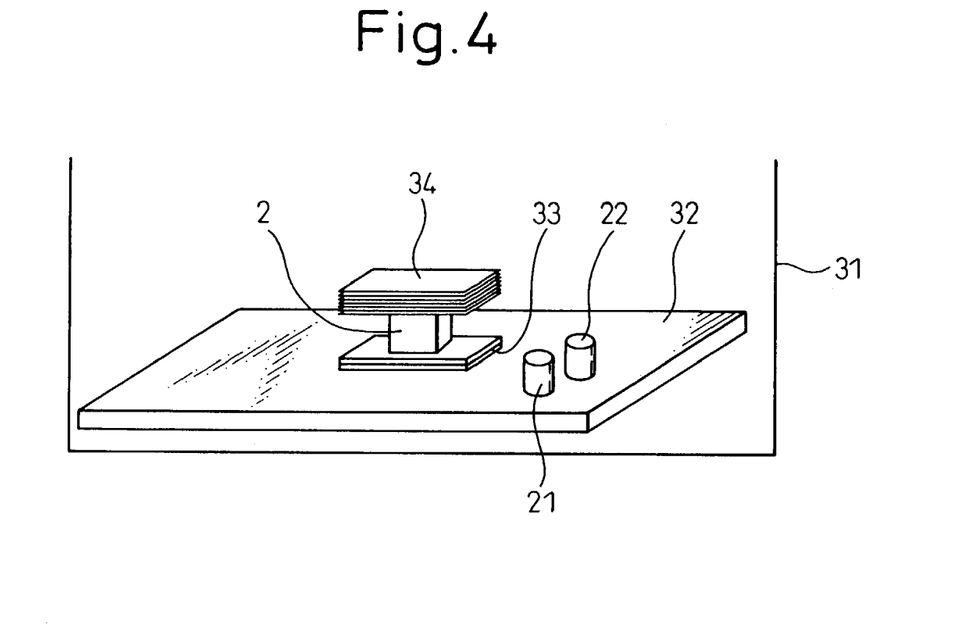
FIG. 4 is an explanatory view of sintering in Embodiment 1.

Referring to FIG. 4, a sagger 31 is placed into a sintering furnace, not shown, and a magnesia plate 32 is put into the sagger 31. Another small and thin sagger 33 is put on the magnesia plate 32 and an unsintered stacked body 2 is put on this magnesia plate 33. A plurality of thin magnesia plates 34 having porosity of 20% is put on the unsintered stacked body 2.

A cylindrical dielectric layer anti-reducing agent 21 and a cylindrical electrode layer anti-oxidant 22 are arranged adjacent to the unsintered stacked body 2 as shown in the drawing.

The dielectric layer anti-reducing agent 21 is made of PZT and the electrode layer anti-oxidant 22 is made of Cu.

After a cover is put on the sagger 31 shown in FIG. 4, sintering is conducted inside the sintering surface.

A gas consisting of $CO_2$, CO, $O_2$, etc, is introduced into the sintering furnace.

PZT of the dielectric layer anti-reducing agent 21 denatures during sintering and forms metallic lead while emitting oxygen inside the sagger 31. This reaction continues until the oxygen partial pressure reaches a predetermined value inside the sagger 31.

Cu of the electrode layer anti-oxidant 22 is oxidized while absorbing oxygen inside the sagger 31. This reaction continues until the oxygen partial pressure reaches a predetermined value inside the sagger 31.

Therefore, the oxygen partial pressure is controlled naturally due to sintering inside the sagger 31 and reaches an oxygen partial pressure at which the dielectric layer anti-reducing agent 21 and the electrode anti-oxidant 22 are no longer reduced and oxidized, respectively.

The sagger 31 and the cover do not keep close contact, but gas exchange occurs through this gap between the inside of the sagger 31 and the inside of the sintering furnace. As this gap is not large, however, the oxygen partial pressure inside the sagger 31 is not in conformity with the oxygen partial pressure inside the sintering furnace, and the gas as described above is maintained.

Consequently, neither oxidation of the unsintered electrode layer nor reduction of the unsintered dielectric layer occurs easily in the unsintered stacked body 2.

Sintering of the unsintered stacked body 2 is thus completed and the stacked ceramic body 1 is obtained.

The side surface electrode 14 is bonded to the stacked ceramic body 1 and the lead wires 141 and 142 are bonded to provide a piezoelectric device.

Next, the function and effect of this embodiment will be explained.

To fire the unsintered stacked body 2 in this embodiment, the sintering gas must be controlled to the oxygen partial pressure at which PZT, or the like, of the dielectric layer is not reduced and Cu, or the like, of the electrode layer is not oxidized.

This oxygen partial pressure falls within a predetermined range (dotted region in the drawing) derived from the Ellingham diagram shown in FIG. 3.

In this embodiment, the dielectric layer anti-reducing agent 21 made of PZT and the electrode layer anti-oxidant 22 made of Cu are introduced with the unsintered stacked body 2 into the sagger 31.

In other words, oxidation of the electrode layer is likely to proceed in the sintering gas having a high oxygen partial pressure. However, because the electrode layer anti-oxidant 22 is a material that can be oxidized more easily than the electrode layer, it acquires oxygen and is oxidized. The oxygen partial pressure of the sintering gas drops with the progress of the reaction, and the oxygen partial pressure drops by itself to the pressure at which the electrode layer is not easily oxidized.

Reduction of the dielectric layer is likely to proceed similarly in the sintering gas having a low oxygen partial pressure. However, because the dielectric layer anti-reducing agent 21 is a material that can be reduced more easily than the dielectric layer, it is oxidized earlier than the dielectric layer and emits oxygen in the sintering gas. The oxygen partial pressure of the sintering gas rises with the progress of the reaction, and rises by itself to a pressure at which the reducing layer is not easily reduced.

Because the sintering gas reaches by itself the appropriate oxygen partial pressure in this embodiment as described above, neither oxidation of the electrode layer nor reduction of the dielectric layer occur easily.

Though both of the dielectric layer anti-reducing agent 21 and the electrode layer anti-oxidant 22 are introduced into the sagger 31 in this embodiment, the same effect as that of this embodiment can be acquired by introducing only the dielectric layer anti-reducing agent 21 when the gas introduced into the sintering furnace is a reducing gas. Only the electrode layer anti-oxidant 22 may be introduced when the gas introduced is an oxidizing gas.

(Embodiment 2)

Figure 5:
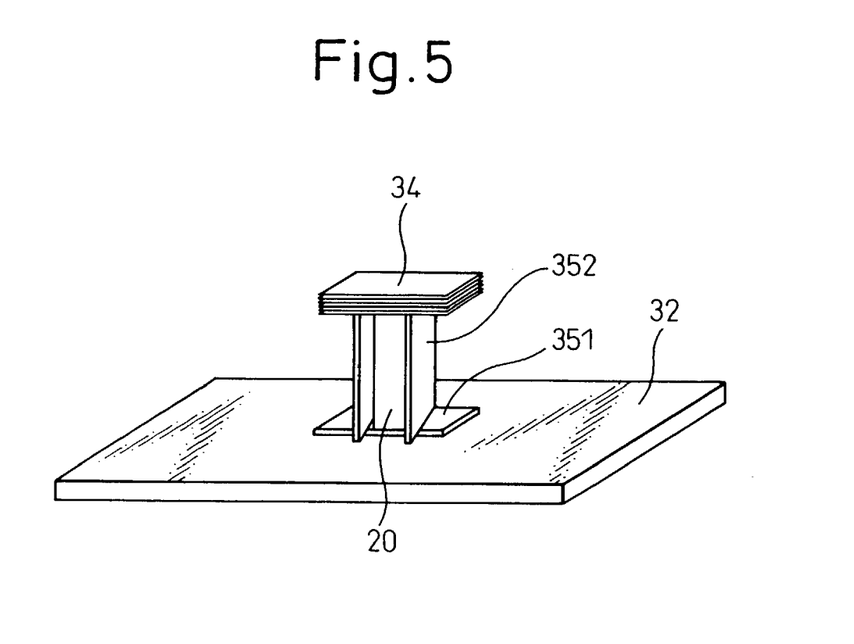
FIG. 5 is an explanatory view of sintering of a unsintered stacked body the four surfaces of which are covered in Embodiment 2.

In this embodiment, sintering is conducted while the four surfaces of the unsintered stacked body 2 are covered with magnesia plates 351, 352 and 34 made of MgO that hardly reacts with the unsintered stacked body 2, as shown in FIG. 5.

When the unsintered stacked body 2 is covered with the magnesia plates 351, 352 and 34, the gas is likely to stay around the periphery of the unsintered stacked body 2. Therefore, the gas of a predetermined oxygen pressure developed by itself as a result of reduction of the unsintered dielectric layer and oxidation of the unsintered electrode layer that are exposed to the surfaces of the unsintered stacked body 2, can be maintained while sintering is continued.

Consequently, a self-developing gas is formed around the unsintered stacked body in the same way as inside the sagger used in Embodiment 1. In other words, the dielectric layer is not easily reduced, the electrode layer is not easily oxidized and an excellent stacked ceramic body can be obtained.

The rest of the details of this embodiment are the same as those of Embodiment 1, and the same function and effect as that of Embodiment 1 can be obtained.

The unsintered stacked body may be covered with magnesia powder in place of the magnesia plates when sintering is conducted in the same way as in this embodiment.

In this case, too, the gas stays around the unsintered stacked body, and a gas having a predetermined oxygen partial pressure, that develops by itself as a result of reduction of the unsintered dielectric layer and oxidation of the unsintered electrode layer, can be maintained while sintering is continued.

In consequence, an excellent gas can be formed around the unsintered stacked body in the same way as in the inside of the sagger of Embodiment 1 in which the dielectric layer is not easily reduced and the electrode layer is not easily oxidized, and an excellent stacked ceramic body can be obtained.

A powder consisting of at least one kind of PZT, $PbZrO_3$ and $PbTiO_3$ may be used as the covering material in place of magnesia to conduct sintering.

In this case, as the powder is reduced, it emits oxygen. A gas is thus formed, in the proximity of the unsintered stacked body covered with such powder, in which the electrode is not oxidized and the dielectric layer is not reduced.

Consequently, an excellent gas can be formed around the unsintered stacked body in the same way as in the inside of the sagger of Embodiment 1 in which the dielectric layer is not easily reduced and the electrode layer is not easily oxidized, and an excellent stacked ceramic body can be obtained.

(Embodiment 3)

Figure 6:
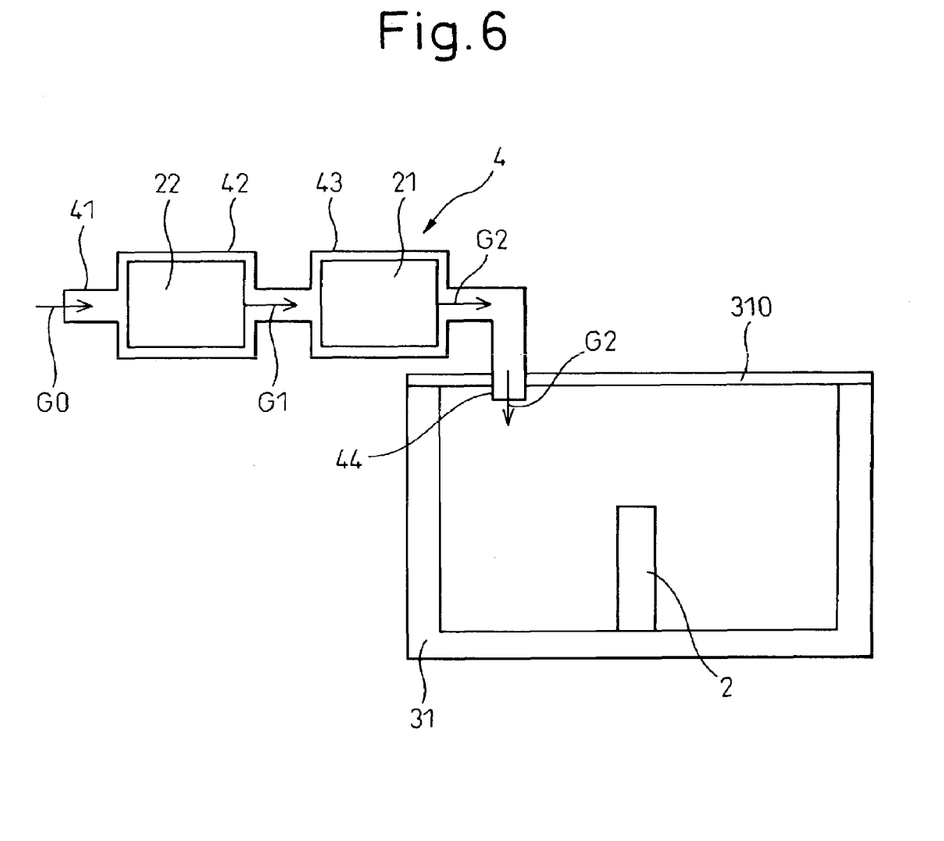
FIG. 6 is an explanatory view of sintering of an unsintered stacked body by introducing a gas in Embodiment 3.

This embodiment represents a method that conducts sintering in a sintering gas after the unsintered stacked body 2 is passed through the dielectric layer antireducing agent and the electrode layer anti-oxidant as shown in FIG. 6.

An explanation will be given next.

Sintering in this embodiment will be explained with reference to FIG. 6.

A gas passage 4 includes a first holding portion 42 which has a gas inlet 41 and in which an electrode layer anti-oxidant of Cu powder is arranged, and a second holding portion 43 in which a dielectric layer anti-reducing agent 21 is arranged, and a communication port 44 to a sagger 31 as a sintering vessel. The gas is introduced into the sagger 31. A cover 310 closes the sagger 31. The sagger 31 is made of magnesium that does not easily react with the unsintered stacked body 2.

Incidentally, the first and second holding portions 42 and 43 are preferably kept at the same temperature as the internal temperature of the sagger 31.

An unsintered stacked body 2 having the same composition as that of Embodiment 1 is prepared in the same way as in Embodiment 1. The unsintered stacked body 2 is put into the sagger 21 and the cover 310 is closed.

The sagger 31 is installed inside a sintering furnace not shown and the gas is introduced into the sagger 31 through the gas passage 4.

The gap between the sagger 31 and the cover 310 is not strictly closed and gas exchange occurs to a certain extent. However, this gas exchange is not conducted to such an extent that the gas inside the sagger 31 changes greatly. In other words, the gas inside the sagger is a self-developing gas.

In the sintering process of this embodiment, the internal temperature of the sintering furnace is first raised to heat the unsintered stacked body 2 together with the sagger 31. After the temperature reaches a predetermined temperature, the gas is introduced from the gas passage 4. The temperature of the gas is heated in advance so that it reaches substantially the same temperature as that of the unsintered stacked body 2.

The gas G0 is introduced from the gas inlet 41. The gas G0 passes through the electrode layer anti-oxidant 22 in the first holding portion 42 and changes to a gas G1. Next, the gas G1 passes through the dielectric layer anti-reducing agent 21 in the second holding portion 43 and changes to a gas G2. This gas G2 is introduced into the sagger 31 from the inlet 44.

Incidentally, the state of the G1 and G2 gasses changes depending on the value of the oxygen partial pressure of the gas G1. However, the electrode layer anti-oxidant 22 removes excessive oxygen whether the oxygen partial pressure of the gas G0 is be high or low, and the dielectric layer anti-reducing agent 21 supplements insufficient oxygen.

An excellent stacked ceramic body the dielectric layer of which is not easily reduced and the electrode layer of which is not easily oxidized can be obtained in this way.

The rest of the details are the same as those of Embodiment 1, and the same function and effect can be obtained in the same way.

(Embodiment 4)

This embodiment uses a sealed sintering vessel when the unsintered stacked body is sintered.

In other words, the unsintered stacked body is introduced into the sintering vessel, and the sintering vessel is brought into vacuum.

A gas is thereafter introduced so that the inside of the sintering vessel attains a predetermined oxygen partial pressure. The sintering vessel is heated to fire the unsintered stacked body.

In this embodiment, the inside of the sintering vessel is once brought into vacuum and the gas is then introduced so as to achieve the predetermined oxygen partial pressure. Therefore, the oxygen partial pressure can be easily regulated. Further, because a gas exchange does not occur easily between the sintering gas inside the sintering vessel and the outside, the sintering gas around the unsintered stacked body remains a gas having an oxygen partial pressure at which the electrode layer is not oxidized and the dielectric layer is not reduced, due to absorption of oxygen with oxidation of the electrode layer and due to emission of oxygen with reduction of the dielectric layer.

An excellent stacked ceramic body, the dielectric layer of which is not easily reduced and the electrode layer of which is not easily oxidized, can be obtained in this way.

The rest of the details are the same as those of Embodiment 1, and the same function and effect can be obtained in the same way.

What is claimed is:

1. A method for producing a stacked ceramic body by alternately stacking dielectric layers and electrode layers, comprising the steps of:

preparing an unsintered stacked body by alternately stacking unsintered dielectric layers containing a PZT type dielectric material and unsintered electrode layers containing an electrode material made of a base metal; and sintering said unsintered stacked body inside a sintering gas to which a gas which has passed through a dielectric layer anti-reducing agent and through an electrode layer anti-oxidant is introduced.

2. A method for producing a stacked ceramic body as defined in claim 1, wherein said electrode layer anti-oxidant consists of at least one of Cu and $Cu_2O$.

3. A method for producing a stacked ceramic body as defined in claim 1, wherein said dielectric layer anti-reducing agent consists of at least one member selected from the group consisting of PbO, $PbTiQ_2$, PZT, $PbZrO_3$, CuO and $Cu_2O$.

4. A method for producing a stacked ceramic body by alternately stacking dielectric layers and electrode layers, comprising the steps of:

preparing an unsintered stacked body by alternately stacking unsintered dielectric layers containing a PZT type dielectric material and unsintered electrode layers containing an electrode material made of a base metal; and sintering said unsintered stacked body in a sintering gas to which an oxidizing atmosphere gas which has passed through an electrode layer anti-oxidant is introduced.

5. A method for producing a stacked ceramic body as defined in claim 4, wherein said electrode layer anti-oxidant consists of at least one of Cu and $Cu_2O$.

6. A method for producing a stacked ceramic body by alternately stacking dielectric layers and electrode layers, comprising the steps of:

preparing an unsintered stacked body by alternately stacking unsintered dielectric layers containing a PZT type dielectric material and unsintered electrode layers containing an electrode material made of a base metal; and sintering said unsintered stacked body in a sintering gas to which a reducing gas which has passed through a dielectric layer anti-reducing agent is introduced.

7. A method for producing a stacked ceramic body as defined in claim 6, wherein said dielectric layer anti-reducing agent consists of at least one member selected from the group consisting of PbO, $PbTiO_2$, PZT, $PbZrO_3$, CuO and $Cu_2O$.

* * * * *